United States Patent [19]
Shiota

[11] Patent Number: 5,272,097
[45] Date of Patent: Dec. 21, 1993

[54] METHOD FOR FABRICATING DIODES FOR ELECTROSTATIC DISCHARGE PROTECTION AND VOLTAGE REFERENCES

[76] Inventor: Philip Shiota, 14270 Old Wood Rd., Saratoga, Calif. 95070

[21] Appl. No.: 864,933

[22] Filed: Apr. 7, 1992

[51] Int. Cl.$^5$ .......................... H01L 21/265
[52] U.S. Cl. .......................... 437/34; 437/57; 437/59; 437/904; 257/355; 257/356; 257/357
[58] Field of Search .............. 437/56, 57, 58, 904, 437/34; 257/357, 328, 355, 356, 487, 546

[56] References Cited

U.S. PATENT DOCUMENTS

| | | | |
|---|---|---|---|
| 3,667,009 | 5/1972 | Rugg | 437/34 |
| 3,787,717 | 1/1974 | Fischer et al. | |
| 4,366,522 | 12/1982 | Baker | |
| 4,400,711 | 8/1983 | Avery | |
| 4,712,152 | 12/1987 | Iio | |
| 4,763,184 | 8/1988 | Krieger et al. | |
| 4,806,999 | 2/1989 | Strauss | |
| 4,875,130 | 10/1989 | Huard | |
| 4,916,085 | 4/1990 | Frisina | 437/44 |
| 4,937,645 | 6/1990 | Ootsuka et al. | |
| 5,081,514 | 1/1992 | Ueoka | |
| 5,144,518 | 9/1992 | Miyazaki | 257/355 |
| 5,182,220 | 1/1993 | Ker et al. | 437/34 |
| 5,182,621 | 1/1993 | Hinooka | 257/357 |

FOREIGN PATENT DOCUMENTS

| | | |
|---|---|---|
| 0042581A2 | 12/1981 | European Pat. Off. |
| 61229347 | 10/1986 | Japan |
| 2090701A | 7/1982 | United Kingdom |
| 2234126 | 1/1991 | United Kingdom |

OTHER PUBLICATIONS

Internal Chip ESD Phenomena Beyond the Protection Circuit in IEEE/IRPS 1988 pp. 19-25.
New ESD Protection Concept for VLSI CMOS Circuits Avoiding Circuit Stress 1991 EOS ESD Symposium Proceedings, pp. 74-82.

Primary Examiner—Olik Chaudhuri
Assistant Examiner—H. Jey Tsai
Attorney, Agent, or Firm—Steven F. Caserza

[57] ABSTRACT

A novel process is taught for forming diodes simultaneously with the formation of typical prior art LDD MOS devices. The diodes thus formed have low breakdown voltages, making them suitable for use as voltage reference diodes, or diodes for ESD protection.

18 Claims, 15 Drawing Sheets

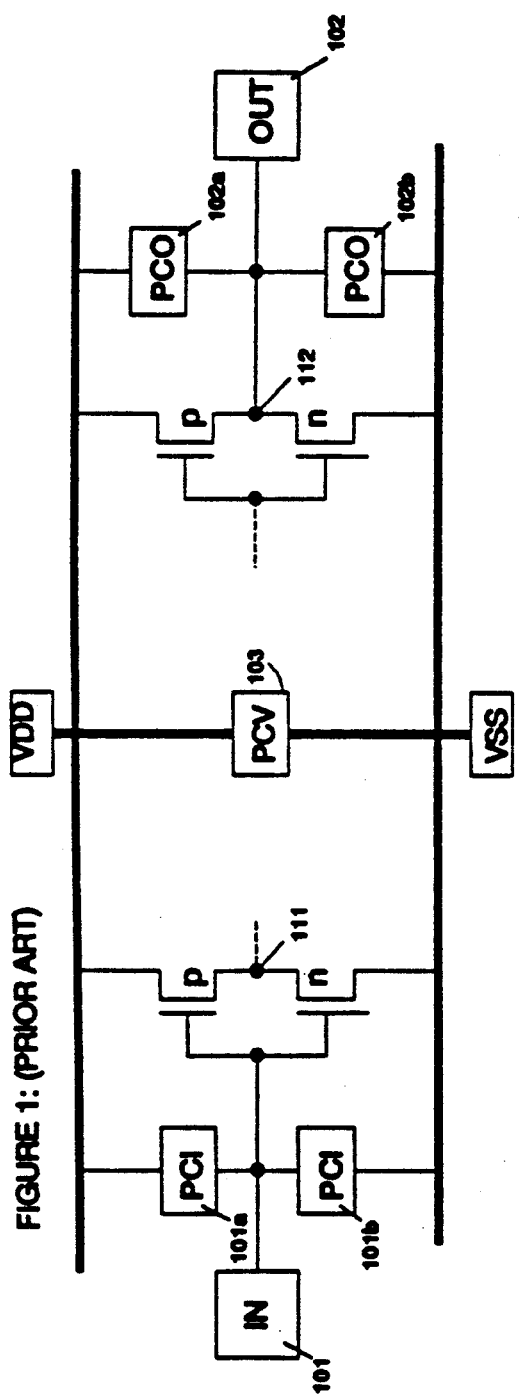
FIGURE 1: (PRIOR ART)
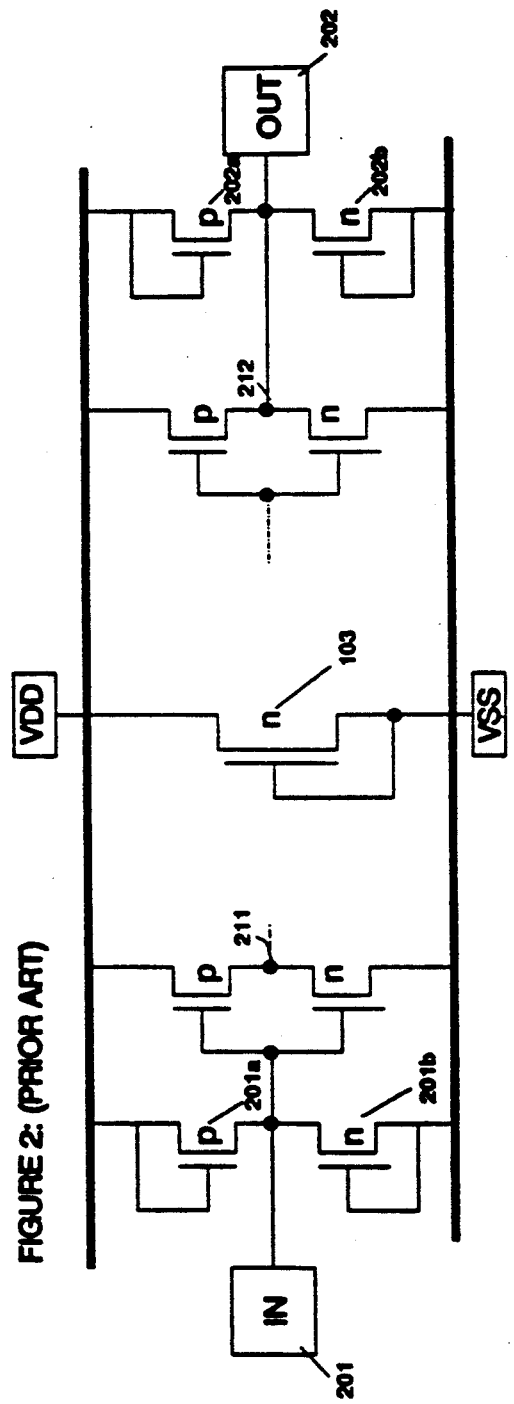
FIGURE 2: (PRIOR ART)

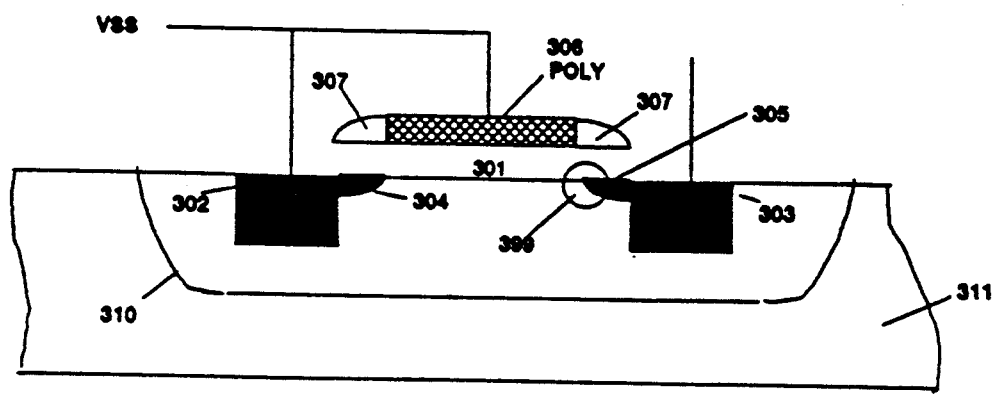
FIGURE 3: (PRIOR ART)
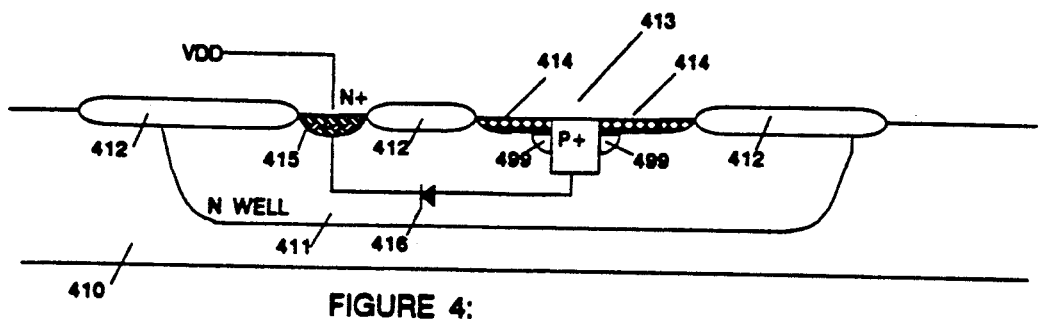
FIGURE 4:
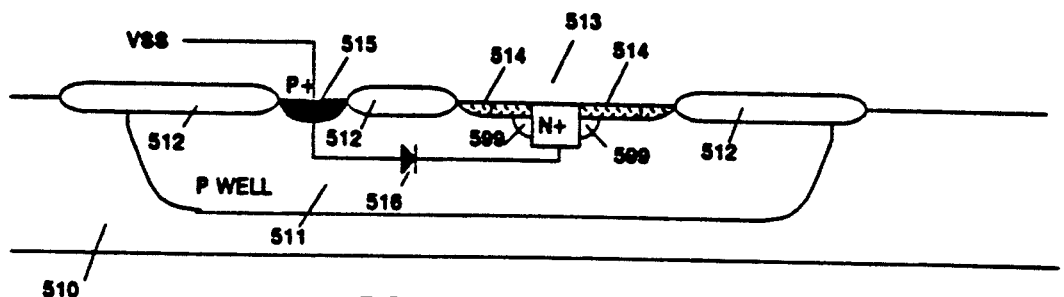
FIGURE 5:

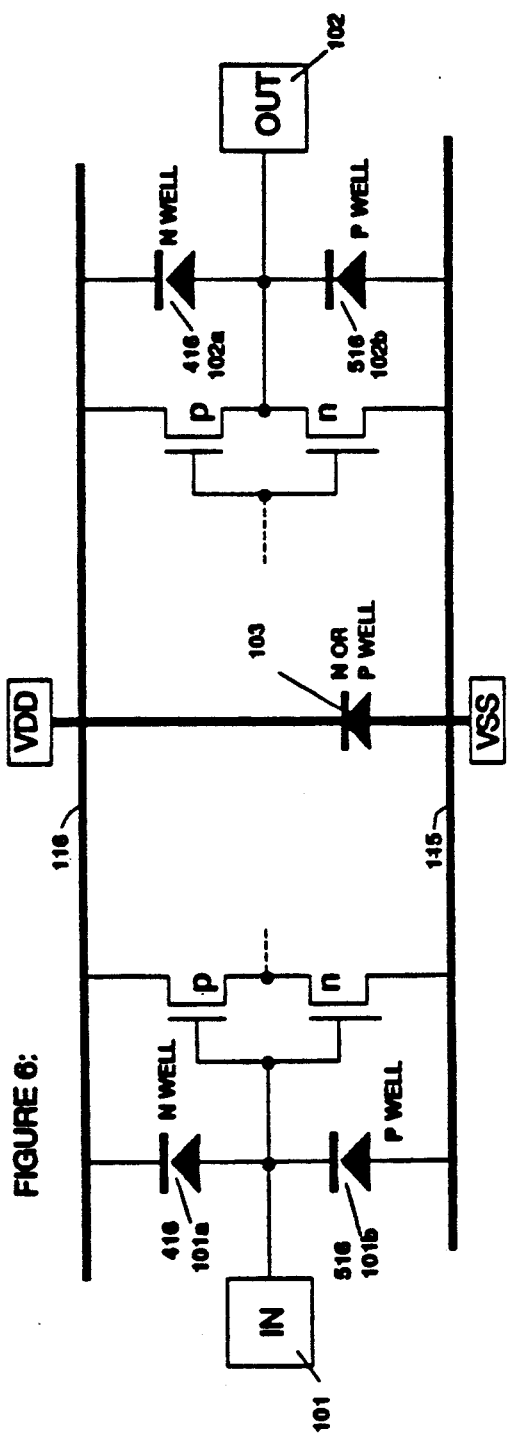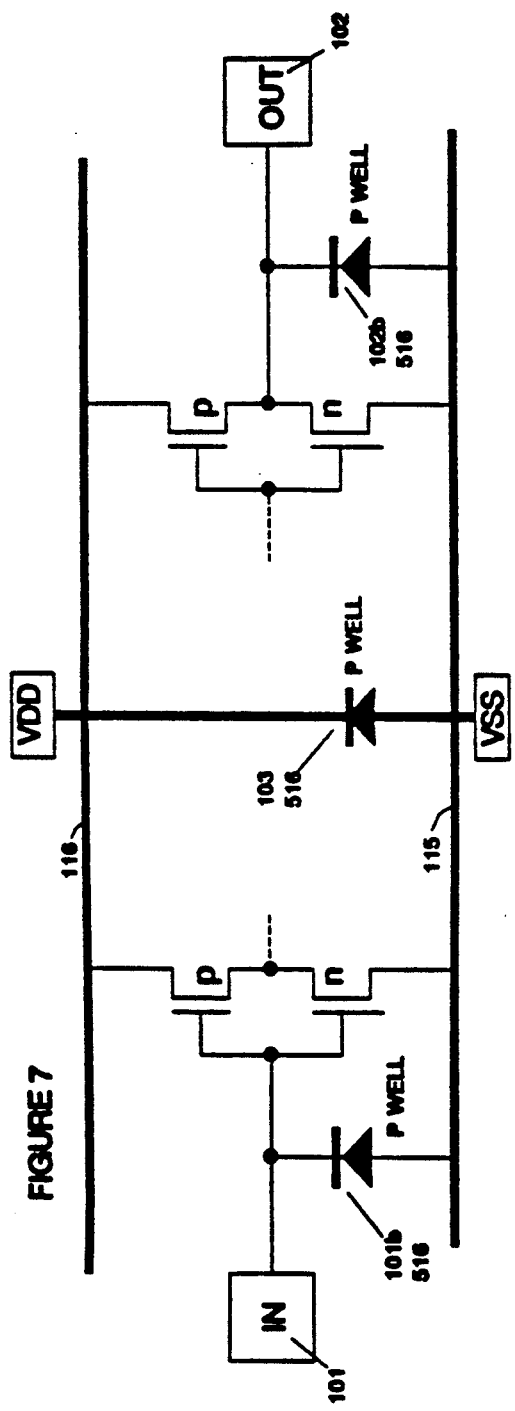

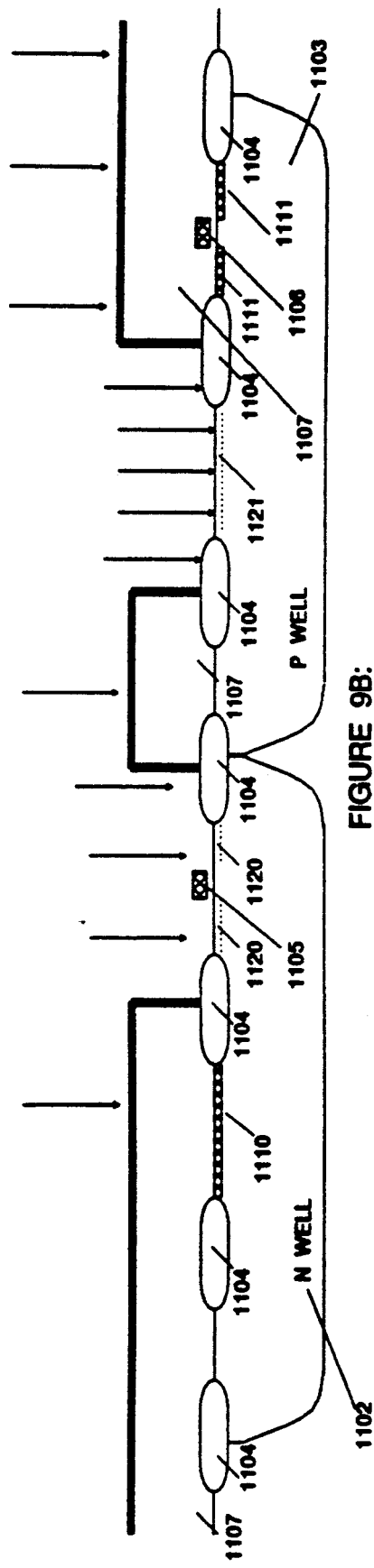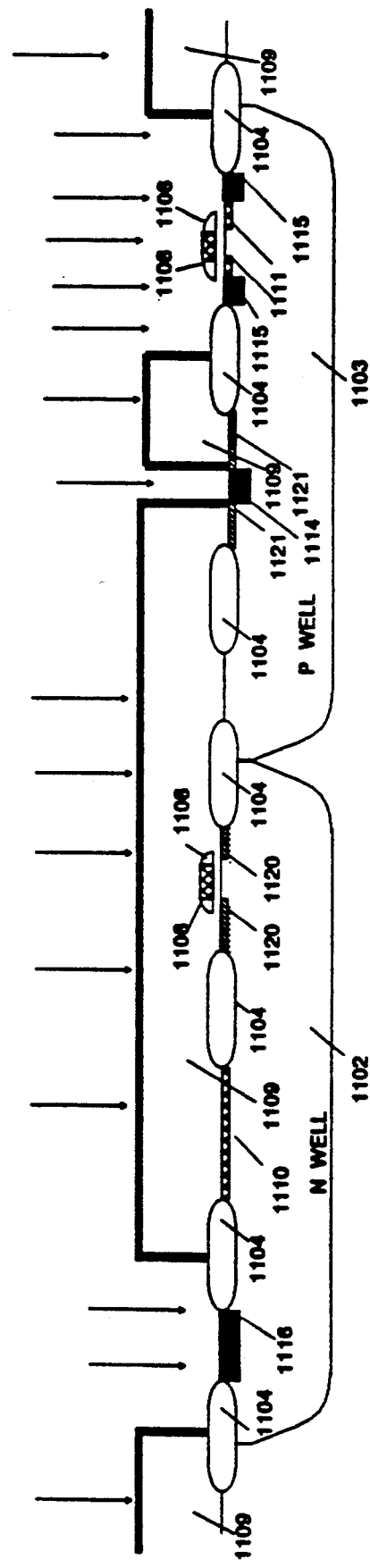

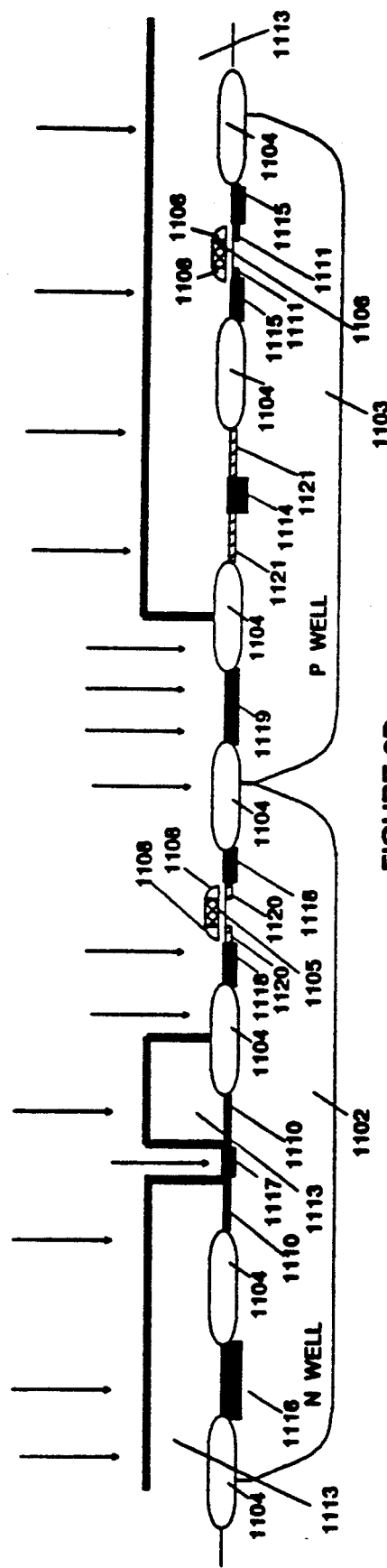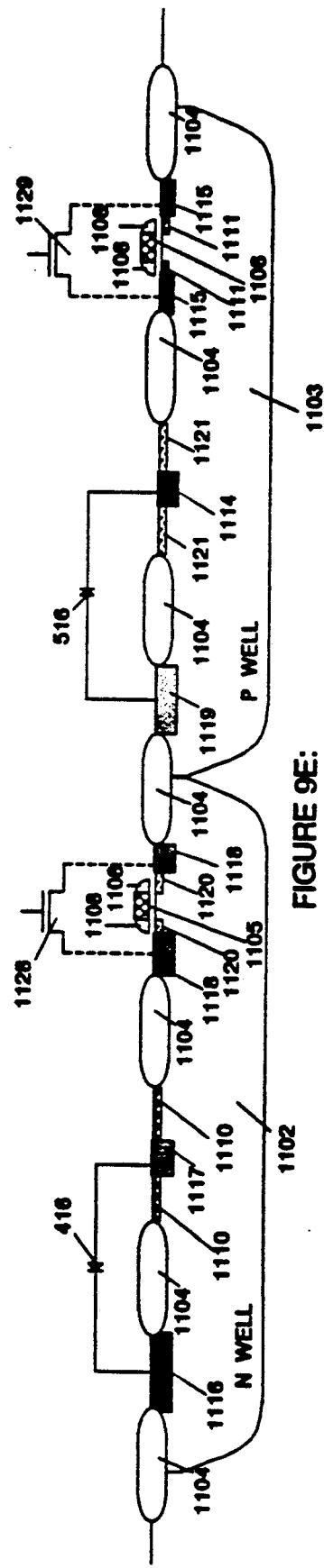

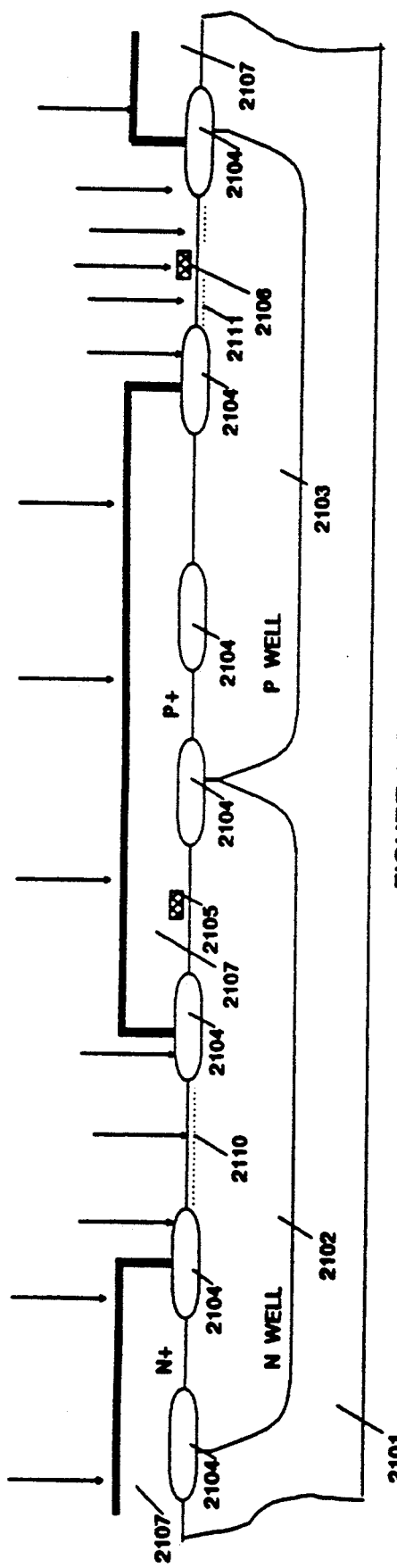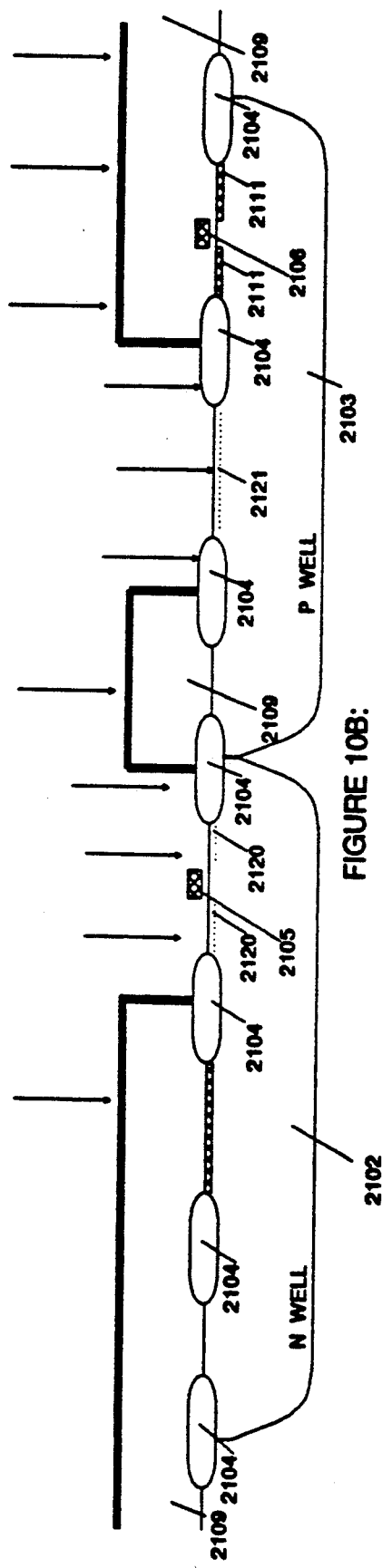
FIGURE 10A:
FIGURE 10B:

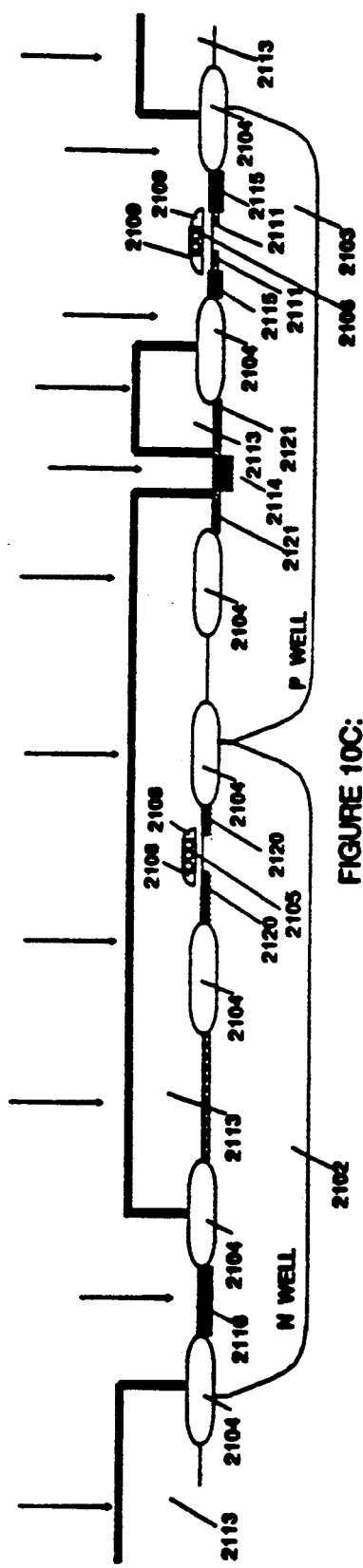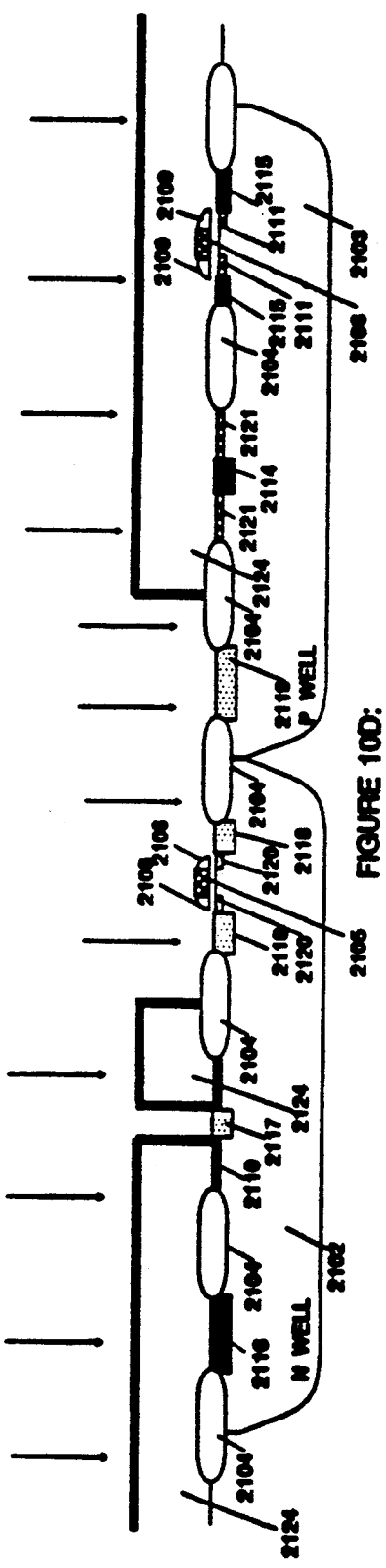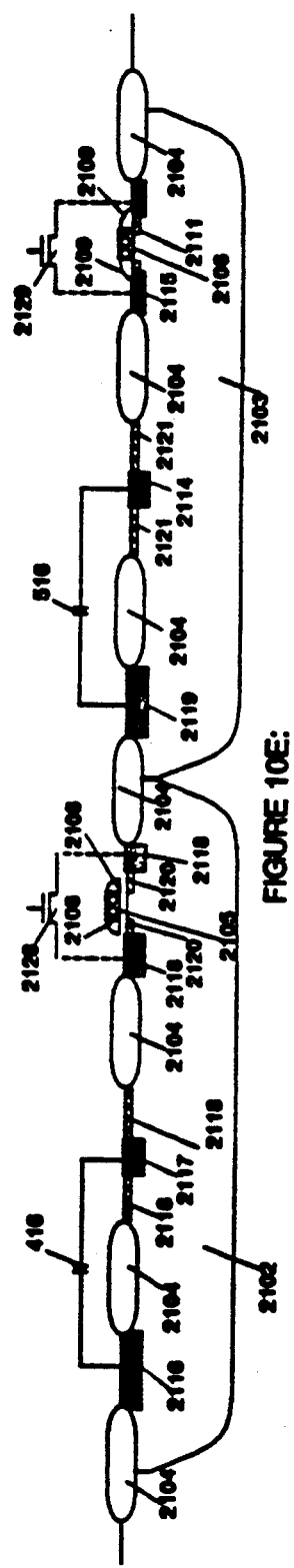

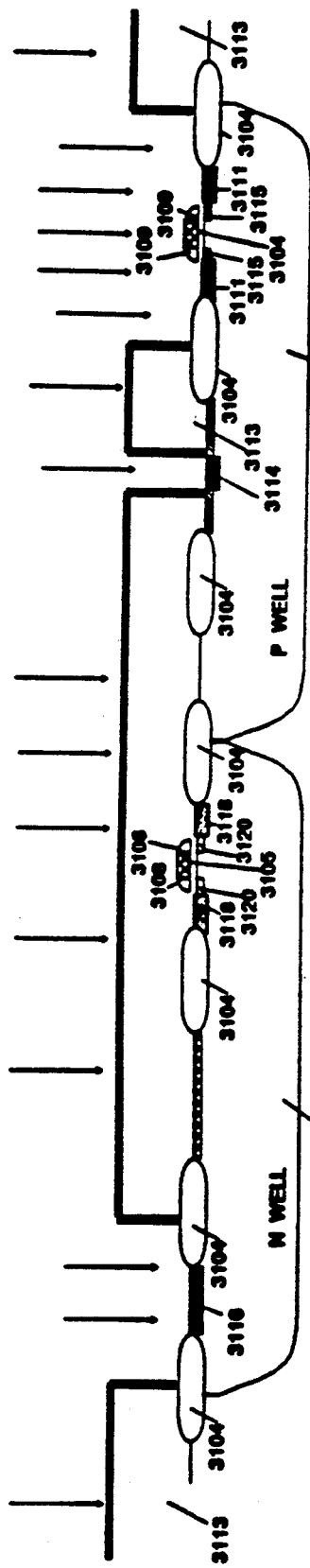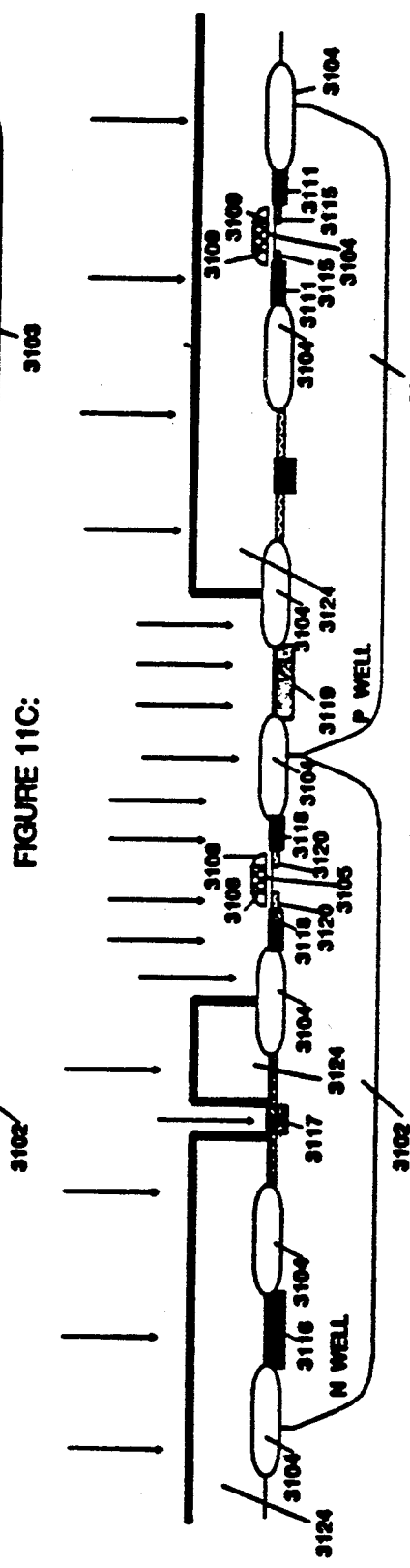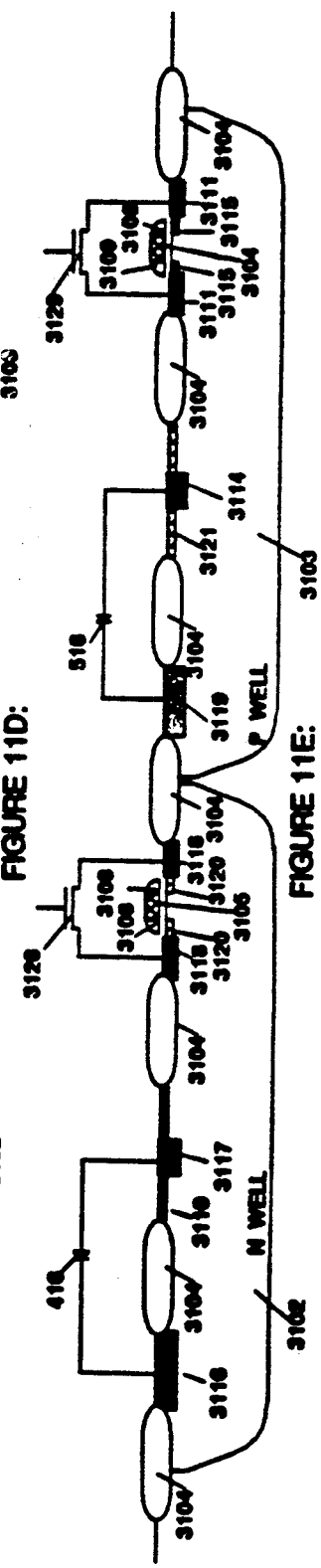

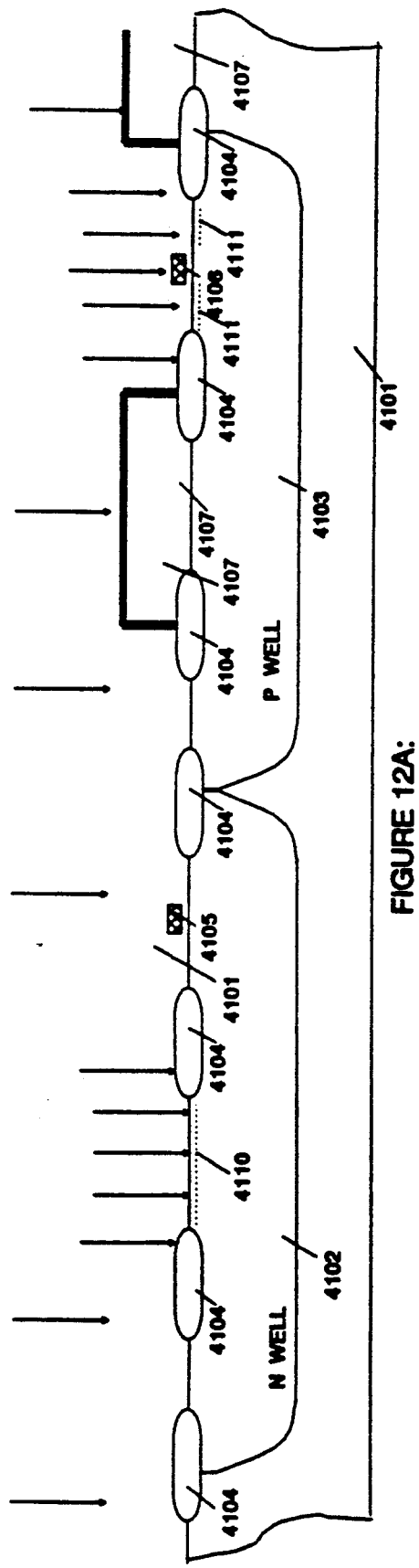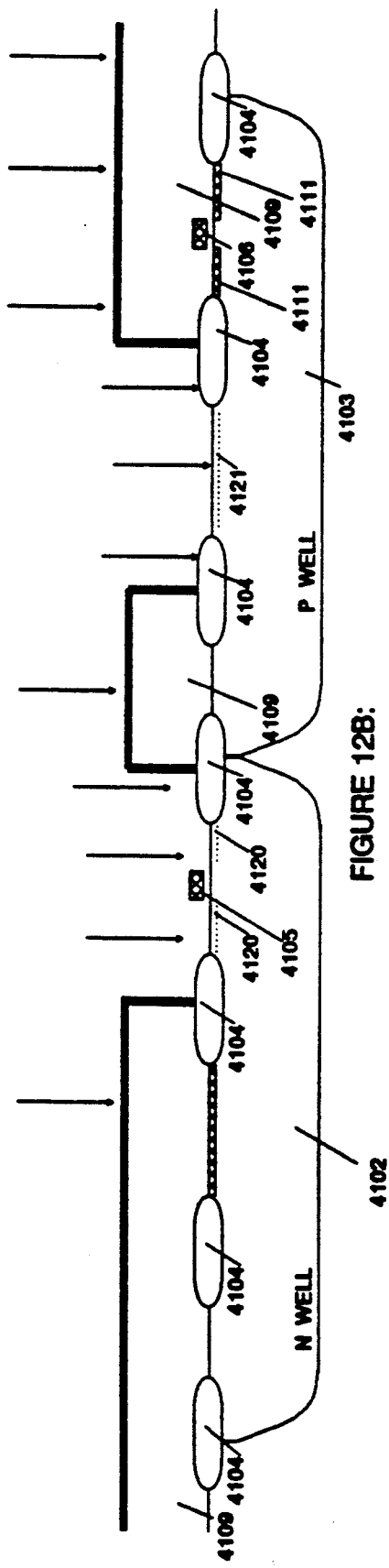

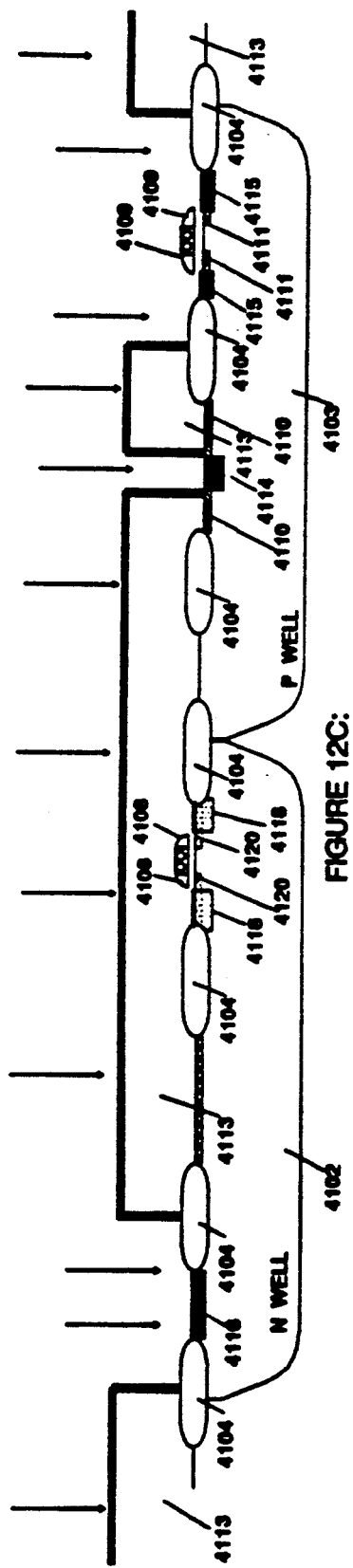
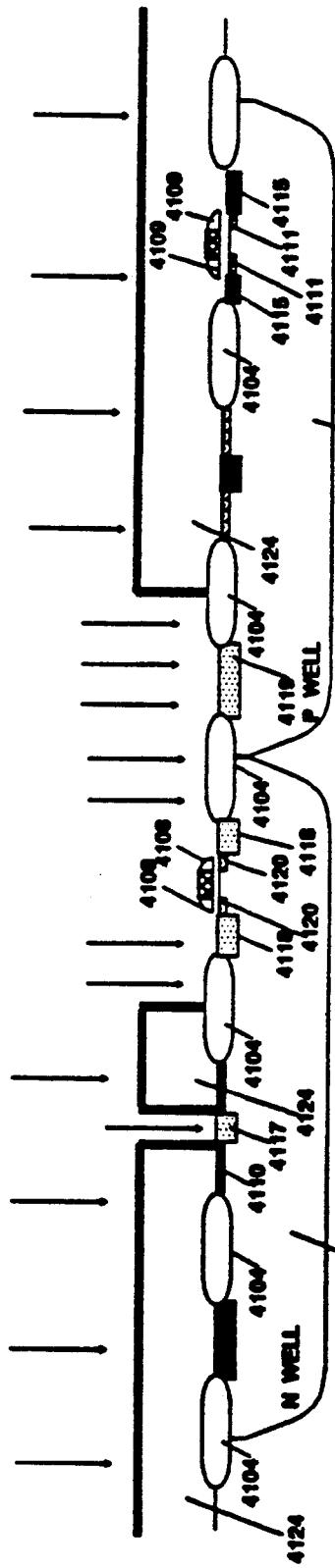
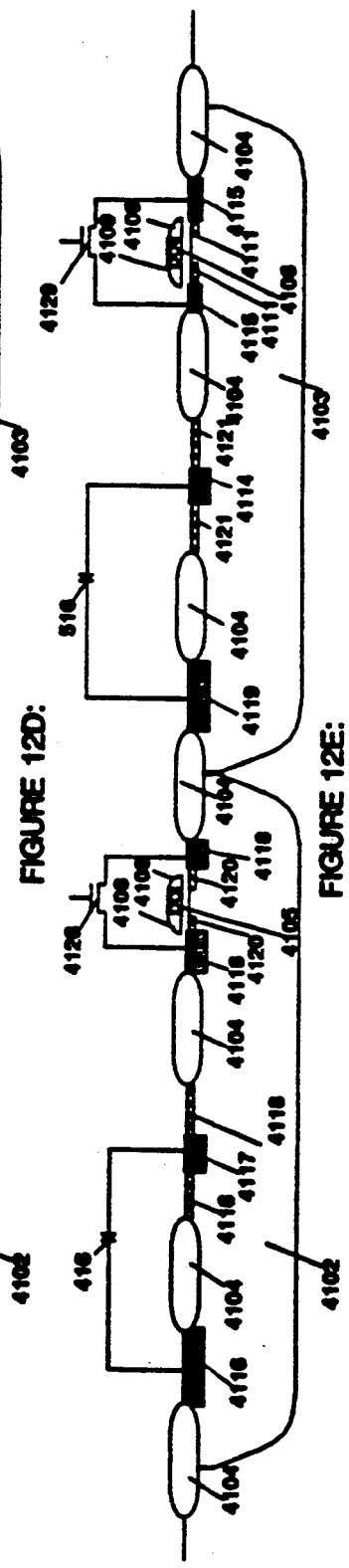

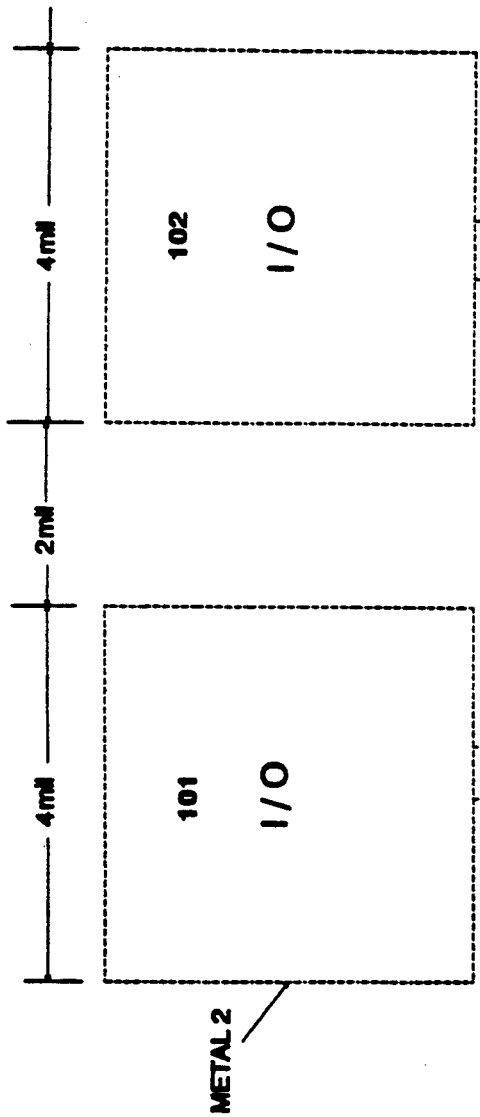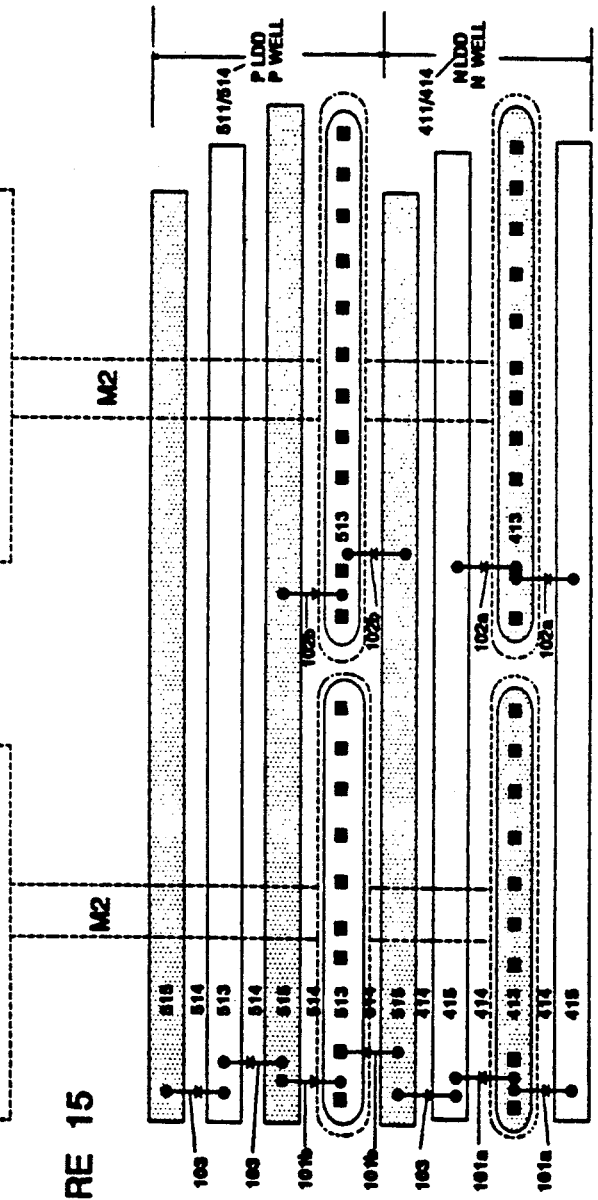
FIGURE 15

METHOD FOR FABRICATING DIODES FOR ELECTROSTATIC DISCHARGE PROTECTION AND VOLTAGE REFERENCES

INTRODUCTION

1. Technical Field

This invention pertains to semiconductor devices, particularly with respect to electrostatic discharge protection.

2. Background

CMOS integrated circuits of current technologies require very thorough protection against Electrostatic Discharge (ESD) phenomena. The susceptibility of VLSI CMOS circuits to excessive voltages and currents caused by ESD requires effective protection of all circuit pins. FIG. 1 shows the commonly used protection mechanism, where input protection circuits (PCI) 101a and 101b are used to protect input circuit 111 from undesired ESD voltages received on input pin 101. Similarly, output protection circuits (PCO) 102a and 102b protect output circuit 112 from undesired ESD voltages appearing on output pin 102. Voltage supply protection circuit (PCV) 103 protects the entire circuit from ESD voltages appearing on either one or both of the VSS and VDD supply pins. It has been reported in the article "Internal Chip ESD Phenomena Beyond the Protection Circuit" by Duvvury et. al., IEEE/IRPS, 1988, pages 19-25, that all commonly used protection circuits cause a circuit stress to the "protected" circuit. In other words, circuit protection as it exists today is not very effective.

The common ESD protection practice, as depicted in FIG. 2, is to use grounded gate thick or thin oxide transistors 201a, 201b, 202a, 202b. The drawback of using thin oxide transistors is that the breakdown voltage of the grounded gate transistor approaches the thin oxide breakdown voltage. The breakdown of these transistors in the grounded gate mode is approximately 13-17 volts, depending on dopant concentrations and distributions. The typical oxide breakdown is 15-17 volts for approximately 175 angstrom gate oxide and the grounded gate thin oxide breakdown is 12-14 volts. Thus, the breakdown margin between device breakdown may be inadequate at only several volts.

FIG. 3 is an illustration depicting the proximity of the breakdown region of the grounded gate thin oxide transistor, including source/drain regions 302, 303, lightly doped source/drain extensions 304, 305, thin gate oxide 301, polycrystalline silicon gate electrode 306, and sidewall spacers 307. The channel region is formed between the source/drain extensions 304, 305 within P well 310 in substrate 311. It is influenced by the control voltage applied to polycrystalline silicon gate 306, in this instance VSS, which is also applied to source/drain region 302. The input or output structure to be protected is connected to source/drain region 303. With the breakdown of the thin gate occurring in region 399 so close to thin gate oxide 301, a potentially unreliable device is created. The thin oxide grounded gate configuration is used because this device has a lower breakdown than the thick oxide field transistor; in fact it gives the lowest controlled breakdown voltage of all devices commonly available on the chip today. In fact the thick field transistor, whether operated as grounded gate or high gate, will probably surpass the breakdown voltage of the thin gate oxide and hence is useless for protection. Since the grounded gate thin oxide transistor has a breakdown between 12-14 volts, this limits the thinness of the gate oxide which may be used. The gate oxide breakdown must be greater than the protection device breakdown. Generally for low voltage lap top or portable operation, it is desirable to have maximum drive for a given threshold voltage. One way to accomplish this is by thinning the gate oxide to increase the $I_{dss}$ of the transistor. If the protection device is limited to 12 volts breakdown, at best this will limit gate oxide to at least 140 angstroms. On the other hand, if 8.0 volts is the breakdown of the protection device it would be possible to decrease the oxide thickness to approximately 100 angstroms. This would increase the drive by approximately 40% over the thin gate protected circuit.

The N+ and P+ diffusions available in CMOS processes may be used to make a diode but since these two diffusions are usually of such high concentrations, they lead to poor I/V characteristics, i.e., they are usually very leaky and have very poor V/I knee characteristics. These characteristics make such a diode a poor candidate for a protection device, having a typical breakdown of 4.5 volts, and unacceptably less than the typical 5.0 volt power supply voltage.

SUMMARY

In accordance with the teachings of those inventions, a novel process is taught for forming diodes in a process which simultaneously forms MOS or CMOS devices. These diodes have relatively low breakdown voltage, making them suitable for ESD protection devices or as voltage reference diodes.

BRIEF DESCRIPTION OF DRAWINGS

FIG. 1 is a schematic diagram depicting a typical prior art ESD protection scheme;

FIG. 2 is a schematic diagram depicting a typical prior art circuit implementing the ESD protection of FIG. 1;

FIG. 3 is a cross-sectional view of a typical MOS transistor used for ESD protection, showing its breakdown mechanism;

FIG. 4 is a cross-sectional view depicting one embodiment of a diode constructed within an N type region in accordance with the teachings of this invention;

FIG. 5 is a cross-sectional view depicting one embodiment of a diode constructed within a P type region in accordance with the teachings of this invention;

FIGS. 6 through 8 are schematic diagrams depicting various embodiments of ESD protection circuits utilizing the diodes constructed in accordance with the teachings of this invention;

FIGS. 9A through 9E are cross-sectional views depicting a fabrication sequence in accordance with one embodiment of this invention;

FIGS. 10A through 10E are cross-sectional views depicting a fabrication sequence in accordance with another embodiment of this invention;

FIGS. 11A through 11E are cross-sectional views depicting a fabrication sequence in accordance with another embodiment of this invention;

FIGS. 12A through 12E are cross-sectional views depicting a fabrication sequence in accordance with another embodiment of this invention;

FIG. 15 is a plan view including bonding pads;

DETAILED DESCRIPTION

Figure 8:
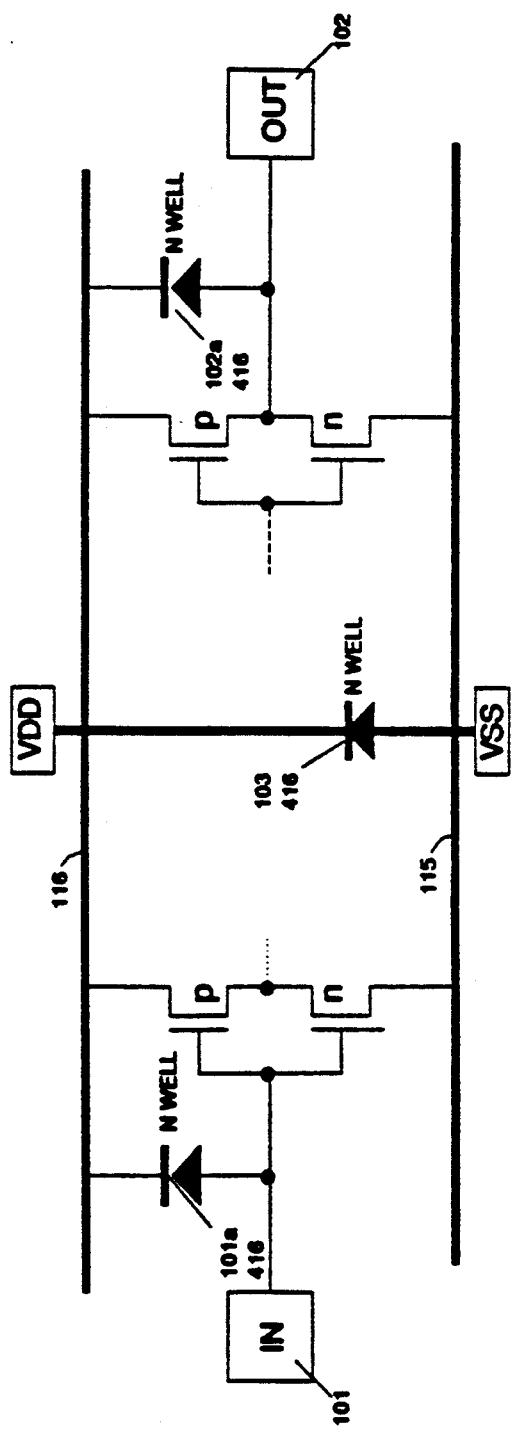

In accordance with the teachings of this invention, a low voltage protection device is taught which is capable of being fabricated simultaneously with the fabrication of typical prior art MOS or CMOS devices which include lightly doped drain devices. In accordance with the teachings of this invention, such protection diodes can be formed without the need for additional masking or implantation steps. The protection diodes of this invention are compatible with the current process technology including one micron and smaller CMOS and MOS process flows. In accordance with the teachings of this invention, the use of lower breakdown voltage protection devices allows the use of thinner gate oxide, thereby enhancing operating speed and increasing transistor drive, without sacrificing reliability. Utilizing diodes in accordance with the teachings of this invention for ESD protection alleviates the problem associated with prior art use of thin oxide transistors for this purpose, in which the thin oxide is placed at risk. In accordance with the teachings of this invention, series resistors are not needed in order to affectuate ESD protection, thereby saving integrated circuit area, as well as affording greater ESD protection by quickly dissipating ESD potentials through a low impedance path.

Examples of the protection diodes of this invention are shown in cross-section in FIGS. 4 and 5. Since the diodes are formed in bulk CMOS, the N well diode has one side connected to VDD and the P well has one junction connected to VSS, as shown in FIGS. 4 and 5, respectively.

Referring to FIG. 4, within N type bulk 410 is formed N well 411, in a well known manner. Field oxide regions 412 are also formed in a well known manner in order to expose only those portions of the substrate surface which are of interest for electrical connections and further doping. Within N well 411 is formed N type regions 414 surrounding P+ region 413, and spaced apart N+ region 415. An N protection diode in accordance with the teachings of this invention, shown in representative format as diode 416, is formed having its anode as P+ region 413 and its cathode as N+ region 415. In this example, cathode 415 of protection diode 416 is connected to positive supply VDD, and anode 413 of protection diode 416 is connected to the input or output device to be protected (not shown). As shown in FIG. 4, reverse breakdown occurs in region 499 where N type region 414 and P+ anode 413 have their greatest dopant differential. In accordance with the teachings of this invention, N well protection diode 416 meets the requirement:

$$(VDD-VSS) < (\text{diode breakdown voltage}) << (\text{thin oxide breakdown voltage}) \qquad (1)$$

Referring to FIG. 5, within N type bulk 510 is formed P well 511, in a well known manner. Field oxide regions 512 are also formed in a well known manner in order to expose only those portions of the substrate surface which are of interest for electrical connections and further doping. Within P well 511 is formed P type regions 514 surrounding N+ region 513, and spaced apart P+ region 515. A P protection diode in accordance with the teachings of this invention, shown in representative format as diode 516, is formed having its anode as P+ region 515 and its cathode as N+ region 513. In this example, anode 515 of protection diode 516 is connected to negative supply VSS, and cathode 513 of protection diode 516 is connected to the input or output device to be protected (not shown). As shown in FIG. 5, reverse breakdown occurs in region 599 where P type region 514 and N+ cathode 513 have their greatest dopant differential.

FIG. 6 illustrates the use of novel diodes 416 and 516 of FIGS. 4 and 5, respectively, as VDD input protection diode 101a, VDD output protection diode 102a, and VSS input protection diode 101b, VSS output protection diode 102b, respectively Voltage supply protection diode 103 can be fabricated as either N well diode 416 of FIG. 4 or P well diode 516 of FIG. 5. The breakdown voltage of the diodes fabricated in accordance with the teachings of this invention is on the order of approximately 8.0 volts. With the protection diodes utilized as shown, the actual protection offered by a diode of this invention is dependent on the size of the protection diode, with larger diodes capable of absorbing larger amounts of charge. Note there is no thin oxide in the region of the breakdown of this structure, thus making the diodes of this invention more desirable for handling ESD than prior art devices.

FIGS. 7 and 8 show alternative embodiments in which protection diodes of this invention provide single ended protection only (protection to only a single power supply), but good protection is provided for both positive and negative ESD, respectively.

Referring to FIG. 7, a positive ESD pulse to input 101 reverse biases input protection diode 101b/516 and forces it into conduction when 8.0 volts is surpassed. The charge then passes to VSS line 115 which is protected by large protection diode 103, which shunts the charge to VDD line 116. On the other hand, a negative ESD pulse to input 101 forward biases input protection diode 101b/516 and the pulse passes to VSS line 115 which is protected by large protection diode 103, which conducts if 8.0 volts is exceeded. Large protection diode 103 limits VDD-VSS to 8.0 volts.

Still referring to FIG. 7, a positive ESD pulse to output 102 reverse biases output protection diode 102b/516 and forces it into conduction when 8.0 volts is surpassed. The charge then passes to VSS line 115 which is protected by large protection diode 103, which shunts the charge to VDD line 116. On the other hand, a negative ESD pulse to output 102 forward biases output protection diode 102b/516 and the pulse passes to VSS line 115 which is protected by large protection diode 103, which conducts if 8.0 volts is exceeded.

A similar ESD protection mechanism is shown in FIG. 8, in which a negative ESD pulse to input 101 reverse biases input protection diode 101a/416 and forces it into conduction when 8.0 volts is surpassed. The charge then passes to VDD line 116 which is protected by large protection diode 103, which shunts the charge to VSS line 115. On the other hand, a positive ESD pulse to input 101 forward biases input protection diode 101a/416 and the pulse passes to VDD line 116 which is protected by large protection diode 103, which conducts if 8.0 volts is exceeded. Thus, large protection diode 103 limits VDD-VSS to 8.0 volts. A negative ESD pulse to output 102 reverse biases output protection diode 102a/416 and forces it into conduction when 8.0 volts is surpassed. The charge then passes to VDD line 116 which is protected by large protection diode 103, which shunts the charge to VSS line 115. On the other hand, a positive ESD pulse to output 102 forward biases output protection diode 102a/416 and the pulse passes to VDD line 116 which is protected by large protection diode 103, which conducts if 8.0 volts is exceeded.

This 8.0 V diode can also be used as a reference diode in ±5.0 V linear circuit systems. In general, reference diodes are difficult to build in an advanced CMOS process because dopant concentrations of the appropriate level to make reliable diodes of low breakdowns are not available. The method of this invention overcomes the limitations of the prior art and provides very good reference diodes.

Figure 9A:
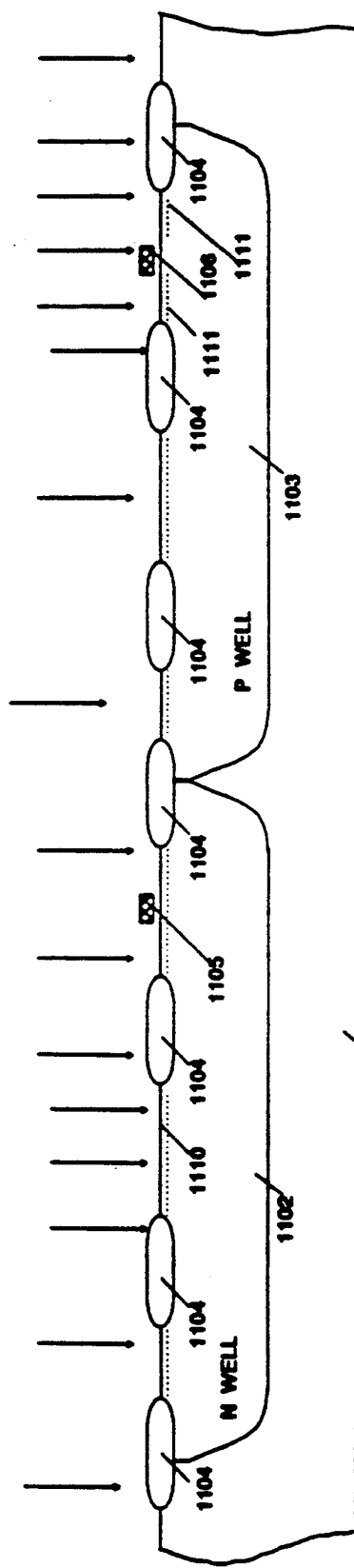

FIGS. 9A through 9E illustrate the fabrication steps of one embodiment of a method for constructing the novel diodes of the invention. Referring to FIG. 9A, substrate 1101 may be either an N type substrate or a P type substrate, as both N well 1102 and P well 1103 are formed therein. If desired, an N type substrate of desired doping may be used, thereby avoiding the need to form N well 1102 or a P type substrate of desired doping may be used, thereby avoiding the need to form P well 1103. N well 1102 is formed in a conventional manner, for example, having a dopant concentration providing a sheet resistivity of approximately 3000 ohms per square. Similarly, P well 1103 is formed in a conventional manner and has a dopant concentration providing, for example, a sheet resistivity of approximately 3000 ohms per square. A layer of field oxide 1104 is formed in a well known manner in order to expose those portions of N well 1102 and P well 1103 for which additional implants are to be performed. A layer of gate oxide (not shown) is then formed, for example, to a thickness of approximately 150Å, and a layer of polycrystalline silicon is formed to a desired conductivity on that gate oxide and patterned in a conventional manner in order to form gate electrodes 1105 and 1106. A blanket N type implant is then performed, for example, using phosphorous dopants implanted to a dose of approximately 2.5E13 at approximately 60 KEV in order to provide a dopant concentration of approximately $2 \times 10^{18}/cm^3$. This forms N channel lightly doped drains 1111 and lightly doped N region 1110, as well as introducing dopants into the other exposed portions of the devices.

As shown in FIG. 9B, resist layer 1107 is used in order to expose only those portions in which a P type implant is desired. At this time, a P type implant is performed, for example, using boron implanted to a dose of approximately 6E13 at approximately 50 KEV to a net (i.e., over-compensated) dopant concentration of approximately $3E18/cm^3$. This forms lightly doped source/drain regions 1120 aligned to gate 1105 within N well 1102, and P type region 1121 within P well 1103. This P type region 1121 is sufficiently concentrated to compensate the previous N type implant in that same region, which was not necessary but introduced by way of convenience in order to allow the N type implant to be a blanket implant. Masking layer 1107 is removed and the device is then oxidized, forming sidewall spacers 1108 on gate electrodes 1105 and 1106. The oxide forming sidewall spacers 1108 is formed to a greater thickness on the sidewalls of polycrystalline silicon gates 1105 and 1106 than is the oxide which is simultaneously formed on single crystal portions of the device, as is well known in the art.

Referring to FIG. 9C, another masking layer 1109 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 1115 to a desired dopant concentration, while sidewall spacers 1108 maintain the previously established dopant level to provide lightly doped source/drain regions 1111, as is well known in the art. N+ region 1114 is also formed within P well 1103, as is N type region 1116 within N well 1102.

Referring to FIG. 9D, another masking layer 1113 is formed to expose those regions which are to receive a P+ implant, which is performed, for example, using boron (BF$_2$) implanted to a dose of approximately 5.5E15 at approximately 60 KEV to achieve a sheet resistivity of approximately 105 ohms per square. This forms P type source/drain regions 1118, while sidewall spacers 1108 maintain the previous doping level of P type lightly doped source/drain extensions 1120. P+ region 1117 is also formed within N well 1102, as is P+ region 1119 within P well 1103. This yields the device shown in the cross-section of FIG. 9E, including N well 1102 having P channel lightly doped drain device 1128 and novel diode 416 constructed in accordance with the teachings of this invention, and P well 1103 including N channel lightly doped drain device 1129 and novel diode 516 constructed in accordance with the teachings of this invention. Of interest, the structure shown in FIG. 9E includes novel diodes constructed in accordance with the teachings of this invention and typical prior art lightly doped drain (LDD) CMOS device fabricated utilizing a simple process without the need for additional masking steps in order to form the additional diodes of this invention.

FIGS. 10A through 10E illustrate the fabrication steps of an alternative embodiment of a method for constructing the novel diodes of the invention. Referring to FIG. 10A, substrate 2101 may be either an N type substrate or a P type substrate, as both N well 2102 and P well 2103 are formed therein. If desired, an N type substrate of desired doping may be used, thereby avoiding the need to form N well 2102 or a P type substrate of desired doping may be used, thereby avoiding the need to form P well 2103. N well 2102 is formed in a conventional manner, for example, having a dopant concentration providing a sheet resistivity of approximately 3000 ohms per square. Similarly, P well 2103 is formed in a conventional manner and having a dopant concentration, for example, providing a sheet resistivity of approximately 3000 ohms per square. A layer of field oxide 2104 is formed in a well known manner in order to expose those portions of N well 2102 and P well 2103 for which additional implants are to be performed. A layer of gate oxide (not shown) is then formed, for example, to a thickness of approximately 150Å, and a layer of polycrystalline silicon is formed to a desired conductivity on that gate oxide and patterned in a conventional manner in order to form P channel gate electrode 2105 and N channel gate electrode 2106. Masking layer 2107 is formed and patterned, and an N type implant is then performed, for example, using phosphorous dopants implanted to a dose of approximately 2.5E13 at approximately 60 KEV in order to form a dopant concentration of approximately $2 \times 10^{18}/cm^3$. This forms lightly doped source/drain regions 2111 aligned to gate 2106 within N well 2103 and lightly doped N region 2110 within N well 2103.

As shown in FIG. 10B, resist layer 2109 is used in order to expose only those portions in which a first P type implant is desired. At this time, a P type implant is performed, for example, using boron implanted to a dose of approximately 2E13 at approximately 50 KEV to a dopant concentration of approximately $3E18/cm^3$. This forms lightly doped source/drain regions 2120 aligned to gate 2105 within N well 2102, and P type region 2121 within P well 2103. Masking layer 2109 is then removed and the device is oxidized, forming sidewall spacers 2108 and 2109 on gate electrodes 2105 and 2106, respectively (FIG. 10C). The oxide forming the sidewall spacers is formed to a greater thickness on the sidewalls of the polycrystalline silicon gate electrodes than is the oxide which is simultaneously formed on single crystalline portions of the device.

Referring to FIG. 10C, another masking layer 2113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 2115 to a desired dopant concentration, while sidewall spacers 2109 maintain the previously established dopant level of lightly doped source/drain extensions 2111, as is well known in the art. N+ region 2114 is also formed within P well 2103, as is N type region 2116 within N well 2102.

Referring to FIG. 10D, another masking layer 2124 is formed to expose those regions which are to receive a second P type implant which is performed, for example, using boron (BF$_2$) implanted to a dose of approximately 5.5E15 at approximately 60 KEV to achieve a sheet resistivity of approximately 105 ohms per square. This forms P type source/drain regions 2118, while sidewall spacers 2108 maintain the previous doping level of P type lightly doped source/drain extensions 2120. P+ region 2117 is also formed within N well 2102, as is P+ region 2119 within P well 2103. This yields the device shown in the cross-section of FIG. 10E, including N well 2102 having P channel lightly doped drain device 2128 and novel diode 416 constructed in accordance with the teachings of this invention, and P well 2103 including N channel lightly doped drain device 2129 and novel diode 516 constructed in accordance with the teachings of this invention. Of interest, the structure shown in FIG. 10E includes novel diodes constructed in accordance with the teachings of this invention and typical prior art lightly doped drain (LDD) CMOS device fabricated utilizing a simple process without the need for additional masking steps in order to form the additional diodes of this invention. The process of FIG. 10 avoids the blanket N type implant of the process of FIG. 9, and thus the need to overcompensate with P type dopants to form P type regions.

Figure 11A:
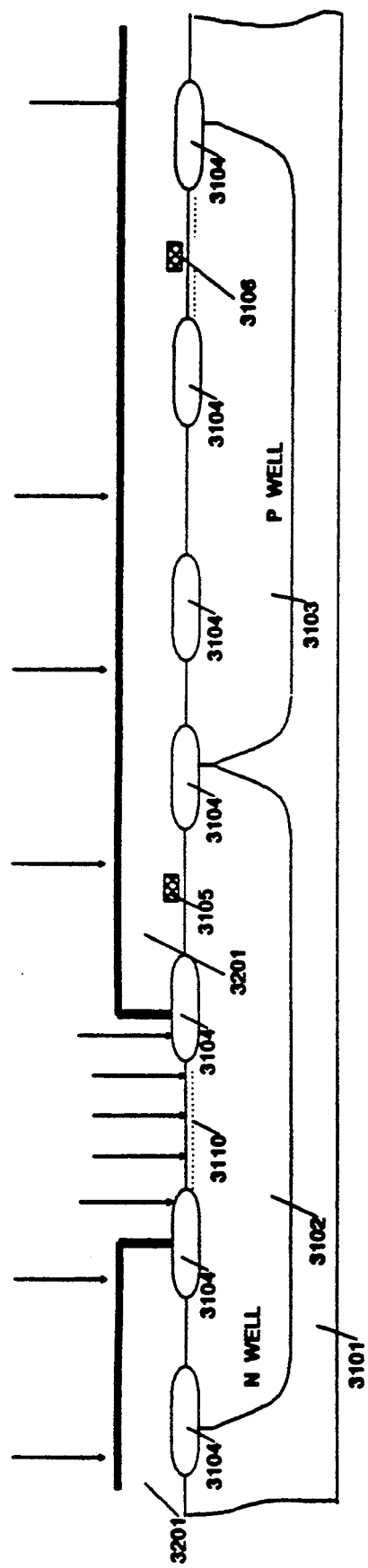

FIGS. 11A through 11E illustrate the fabrication steps of another alternative embodiment of a method for constructing the novel diodes of the invention. Referring to FIG. 11A, substrate 3101 may be either an N type substrate or a P type substrate, as both N well 3102 and P well 3103 are formed therein. If desired, an N type substrate of desired doping may be used, thereby avoiding the need to form N well 3102 or a P type substrate of desired doping may be used, thereby avoiding the need to form P well 3103. N well 3102 is formed in a conventional manner, for example, having a dopant concentration providing a sheet resistivity of approximately 3000 ohms per square. Similarly, P well 3103 is formed in a conventional manner and having a dopant concentration, for example, providing a sheet resistivity of approximately 3000 ohms per square. A layer of field oxide 3104 is formed in a well known manner in order to expose those portions of N well 3102 and P well 3103 for which additional implants are to be performed. A layer of gate oxide (not shown) is then formed, for example, to a thickness of approximately 150Å, and a layer of polycrystalline silicon is formed to a desired conductivity on that gate oxide and patterned in a conventional manner in order to form gate electrodes 3105 and 3106. Masking layer 3201 is then formed and patterned as shown, and an implant is then used to form lightly doped N region 3110. This implant is performed, for example, using phosphorous dopants implanted to a dose of approximately 2.5E13 at approximately 60 KEV in order to form a dopant concentration of approximately $2 \times 10^{18}/cm^3$. In this embodiment, lightly doped drain regions 3115 and 3120 (FIG. 11B) are formed in a well known manner, for example either prior to the masking step which utilizes masking layer 3201, or after one or both of the masking steps which utilize masking layers 3201 and 3107. The device is then oxidized, forming sidewall spacers 3108 and 3109 (Fig. 11C) on gate electrodes 3105 and 3106, respectively. The oxide forming these sidewall spacers is formed to a greater thickness on the sidewalls of the polycrystalline silicon gates than is the oxide which is simultaneously formed on the single crystalline portions of the device.

Figure 11B:
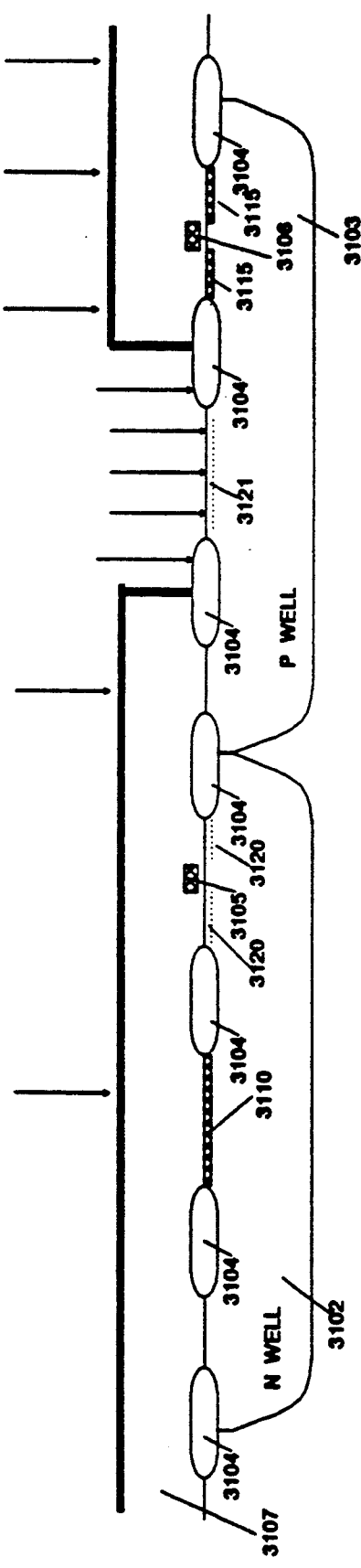

As shown in FIG. 11B, resist layer 3107 is used in order to expose only those portions in which a lightly doped P type region 3121 is to be formed. At this time, a P type implant is performed, for example, using boron implanted to a dose of approximately 6E13 at approximately 50 KEV to a dopant concentration of approximately $3E18/cm^3$.

Referring to FIG. 11C, another masking layer 3113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 3111 to a desired dopant concentration, while sidewall spacers 3109 maintain the previously established dopant level of lightly doped source/drain regions 3115, as is well known in the art. N+ region 3114 is also formed within P well 3103, as is N type region 3116 within N well 3102.

Referring to FIG. 11D, another masking layer 3124 is formed to expose those regions which are to receive a P+ implant, which is performed, for example, using boron (BF$_2$) implanted to a dose of approximately 6E15 at approximately 60 KEV to achieve a sheet resistivity of approximately 105 ohms per square. This forms P type source/drain regions 3118, while sidewall spacers 3108 maintain the previous doping level of P type source/drain extensions 3120. P+ region 3117 is also formed within N well 3102, as is P+ region 3119 within P well 3103. This yields the device shown in the cross-section of FIG. 11E, including N well 3102 having P channel lightly doped drain device 3128 and novel diode 416 constructed in accordance with the teachings of this invention, and P well 3103 including N channel lightly doped drain device 3129 and novel diode 516 constructed in accordance with the teachings of this invention. Of interest, the structure shown in FIG. 11E includes novel diodes constructed in accordance with the teachings of this invention and typical prior art lightly doped drain (LDD) CMOS device fabricated with additional masking steps in order to form the additional diodes of this invention.

FIGS. 12A through 12E illustrate the fabrication steps of an alternative embodiment of a method for constructing the novel diodes of the invention. Referring to FIG. 12A, substrate 4101 may be either an N type substrate or a P type substrate, as both N well 4102 and P well 4103 are formed therein. If desired, an N type substrate of desired doping may be used, thereby avoiding the need to form N well 4102 or a P type substrate of desired doping may be used, thereby avoiding the need to form P well 4103. N well 4102 is formed in a conventional manner, for example, having a dopant concentration providing a sheet resistivity of approximately 3000 ohms per square. Similarly, P well 4103 is formed in a conventional manner and having a dopant concentration, for example, providing a sheet resistivity of approximately 3000 ohms per square. A layer of field oxide 4104 is formed in a well known manner in order to expose those portions of N well 4102 and P well 4103 for which additional implants are to be performed. A layer of gate oxide (not shown) is then formed, for example, to a thickness of approximately 150Å, and a layer of polycrystalline silicon is formed to a desired conductivity on that gate oxide and patterned in a conventional manner in order to form P channel gate electrode 4105 and N channel gate electrode 4106. A masking layer 4107 is formed and patterned, and an N type implant is then performed, for example, using phosphorous dopants implanted to a dose of approximately 2.5E13 at approximately 60 KEV in order to form a dopant concentration of approximately $2 \times 10^{18}/cm^3$. This forms lightly doped drain regions 4111 and lightly doped N region 4110, as well as implanting N type dopants into other exposed portions of the device.

As shown in FIG. 12B, resist layer 4109 is used in order to expose only those portions in which a first P type implant is desired. At this time, a P type implant is performed, for example, using boron implanted to a dose of approximately 2E13 at approximately 50 KEV to a dopant concentration of approximately $3E18/cm^3$. This forms lightly doped source/drain regions 4120 aligned to gate 4105 within N well 4102, and P type region 4121 within P well 4103. Masking layer 4109 is removed and sidewall spacers 4108 and 4109 (FIG. 12C) are now formed on gate electrodes 4105 and 4106, respectively. The oxide forming these sidewall spacers is formed to a greater thickness on the sidewalls of the polycrystalline silicon gate electrodes than is the oxide which is simultaneously formed on single crystalline portions of the device.

Referring to FIG. 12C, another masking layer 4113 is used to expose those portions of the device which are to receive an N type implant. This N type implant is performed, for example, using arsenic implanted to a dose of approximately 5.5E15 at approximately 60 KEV, to a sheet resistivity of approximately 75 ohms per square. This forms source/drain regions 4115 to a desired dopant concentration, while sidewall spacers 4109 maintain the previously established dopant level of lightly doped source/drain regions 4111, as is well known in the art. N+ region 4114 is also formed within P well 4103, as is N type region 4116 within N well 4102.

Referring to FIG. 12D, another masking layer 4124 is formed to expose those regions which are to receive a second P type implant which is performed, for example, using boron (BF$_2$) implanted to a dose of approximately 5.5E15 at approximately 60 KEV to achieve a sheet resistivity of approximately 105 ohms per square. This forms P type source/drain regions 4118, while sidewall spacers 4108 maintain the previous doping level of P type lightly doped source/drain extensions 4120. P+ region 4117 is also formed within N well 4102, as is P+ region 4119 within P well 4103. This yields the device shown in the cross-section of FIG. 12E, including N well 4102 having P channel lightly doped drain device 4128 and novel diode 416 constructed in accordance with the teachings of this invention, and P well 4103 including N channel lightly doped drain device 4129 and novel diode 516 constructed in accordance with the teachings of this invention. Of interest, the structure shown in FIG. 12E includes novel diodes constructed in accordance with the teachings of this invention and typical prior art lightly doped drain (Ldd) CMOS device fabricated utilizing a simple process without the need for additional masking steps in order to form the additional diodes of this invention. The process of FIG. 12 avoids the blanket N type implant of the process of FIG. 9, and thus the need to overcompensate compensate with P type dopants to form P type regions. Also of interest, masking layer 4107 serves to block the N type implant into region 4121, thereby allowing this region 4121 to have a net more highly P type concentration. This reduces the breakdown voltage of the resultant diode 516 (FIG. 12E).

Alternative methods of N+ and P+ doping are suitable, for example, use of polycrystalline silicon barriers and oxide barriers of the source drain regions, in accordance with the teachings of this invention in which increased N well and P well concentrations are provided using the respective Ldd diffusions. This protection method may be used in processes which utilize other gate materials, such as silicides and metal.

BiCMOS devices also utilize Ldd diffusions as in CMOS, and accordingly the method of this invention is suitable for use with BiCMOS circuits.

Figure 13:
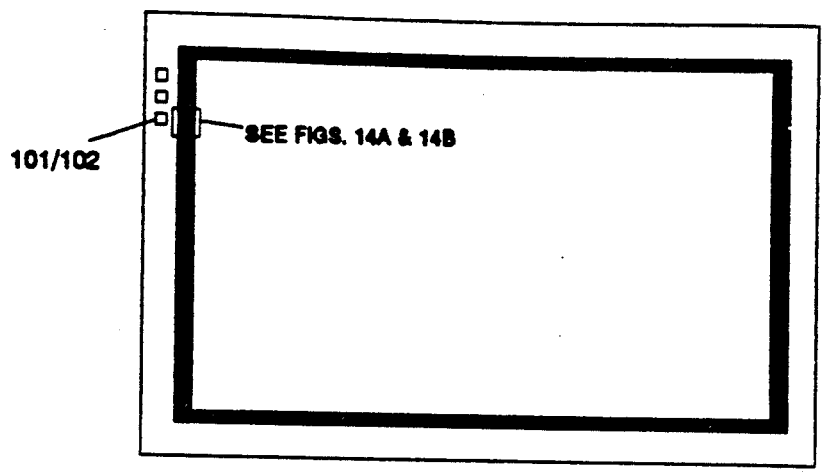
FIG. 13 is a plan view depicting one embodiment of the placement of diodes constructed in accordance with the teachings of this invention in an integrated circuit.

One embodiment of ESD protection devices in use in accordance with this invention is illustrated in the plan view of FIG. 13. In this embodiment, the outer edge of an integrated circuit (but within the location of bending pads 101/102) is encircled (although not necessarily completely) with the protection diodes of this invention.

Figure 14A:
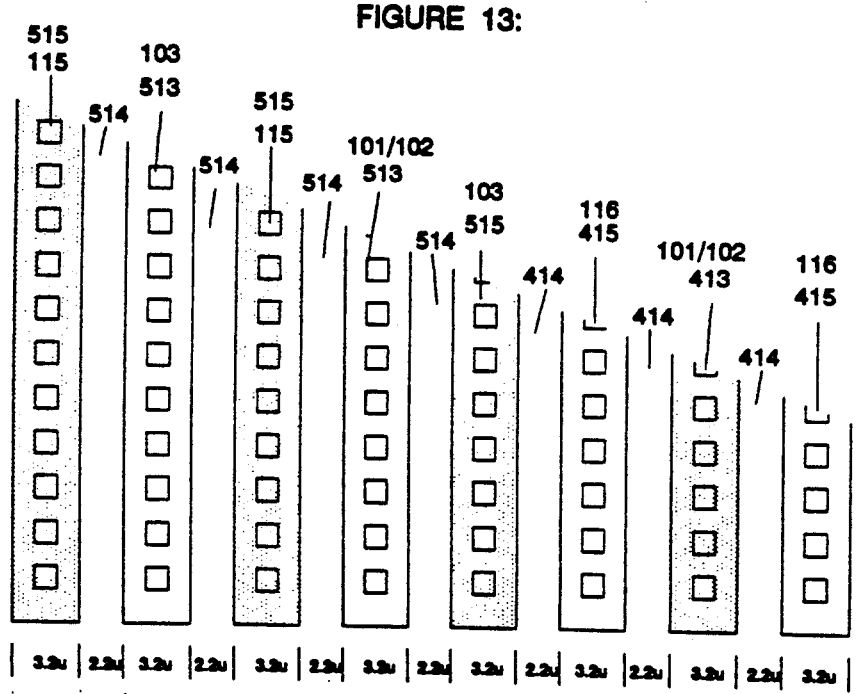
FIGS. 14A and 14B are top and cross-sectional views, respectively, depicting diodes constructed in accordance with the teachings of this invention.
Figure 14B:
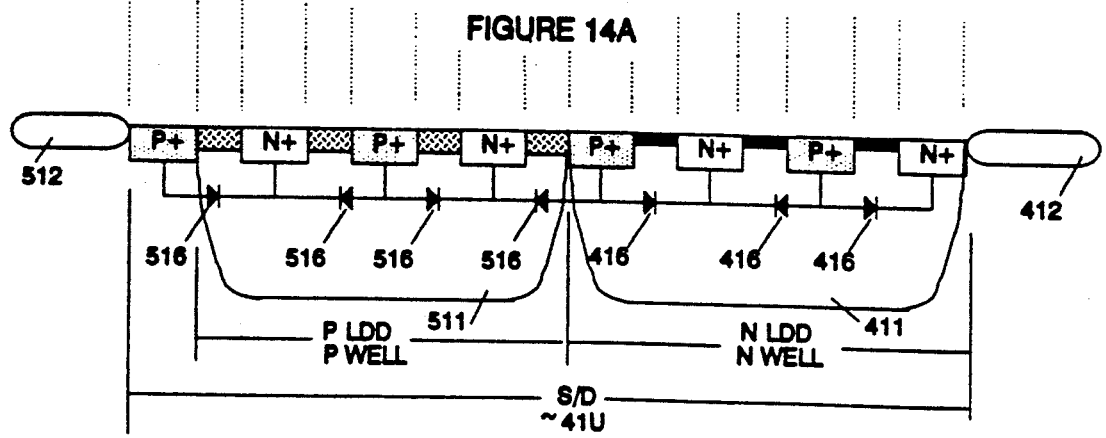

FIG. 14a shows a more detailed plan view of the highlighted portion of the chip shown in FIG. 13. As shown, the peripheral ring includes a plurality of diffused regions formed within P well 511 and N well 411. Reference numerals are used in FIG. 14a which correspond with those utilized in FIGS. 4, 5, and 6. FIG. 14b is a cross sectional view depicting the structure of FIG. 14a, using similar reference numerals. Also shown in FIG. 14b are the diodes constructed in accordance with the teachings of this invention. If desired, metal strapping can be used to provide low impedance paths, for example, for VSS and VDD diffusion, as well as the remaining diffusions shown in FIG. 14a. Also, any number of diffusion strips can be utilized in this fashion, thereby providing a desired number of ESD protection diodes. If desired, only a single bulk region need be employed in this fashion, to provide diodes for ESD protection as described earlier with reference to FIGS. 7 and 8.

FIG. 15 is a more detailed plan view of the structure of FIG. 14a, including input bonding pad 101 and output bonding pad 102. As shown in FIG. 14B, P+ region 515 may be formed outside of P well 511, thereby affording space savings as compared to the embodiment shown in the cross-sectional view of FIG. 5 in which P+ region 515 is formed within P well 511 and separated from region 514 by field oxide 512. Similarly, as shown in the cross-sectional view of FIG. 14B, space savings is achieved by including N+ region 415 within N well 411 and not separated from diffused region 414 by field oxide 412, as is the case in the cross-sectional embodiment of FIG. 4. Diodes are depicted between various diffused regions, and are numbered in accordance with the numbering scheme utilized in FIG. 6. As shown, a second layer of metal M2 is used to connect bonding pads 101 and 102 to their respective diffused regions which in turn form one terminal of the protection diodes constructed in accordance with the teachings of this invention.

Figure 16:
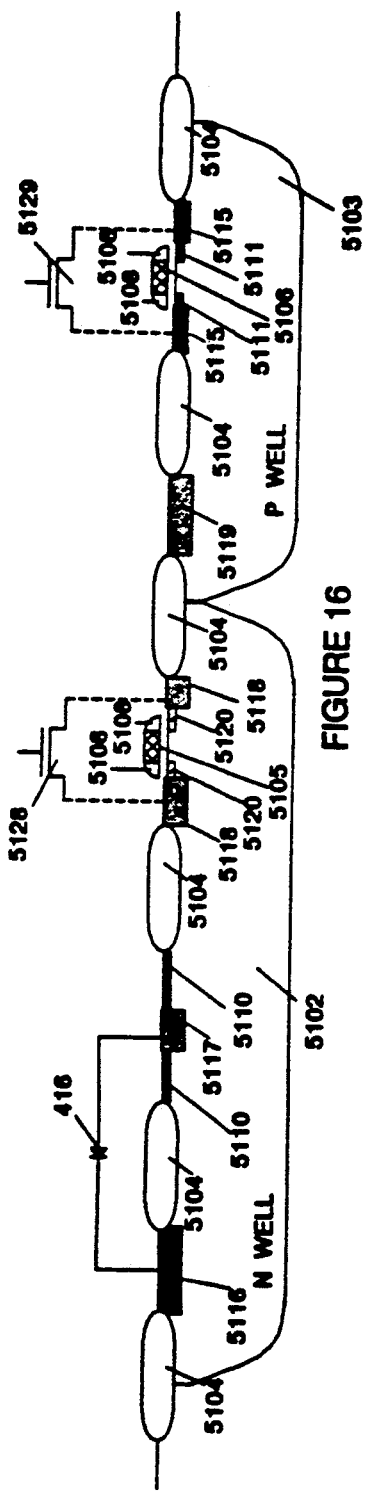
FIG. 16 is a cross sectional view of an alternative embodiment.

FIG. 16 is a cross sectional view depicting an alternative embodiment in which CMOS devices are formed together with a novel diode of this invention in only one bulk region, as described above with reference to FIG. 8. In FIG. 16, P well 5103 includes N channel MOS device 5129 and P type P well contact 5119. N well 5102 includes P channel MOS device 5128 (which need not include lightly doped source/drain regions), and novel diode 416.

Figure 17:
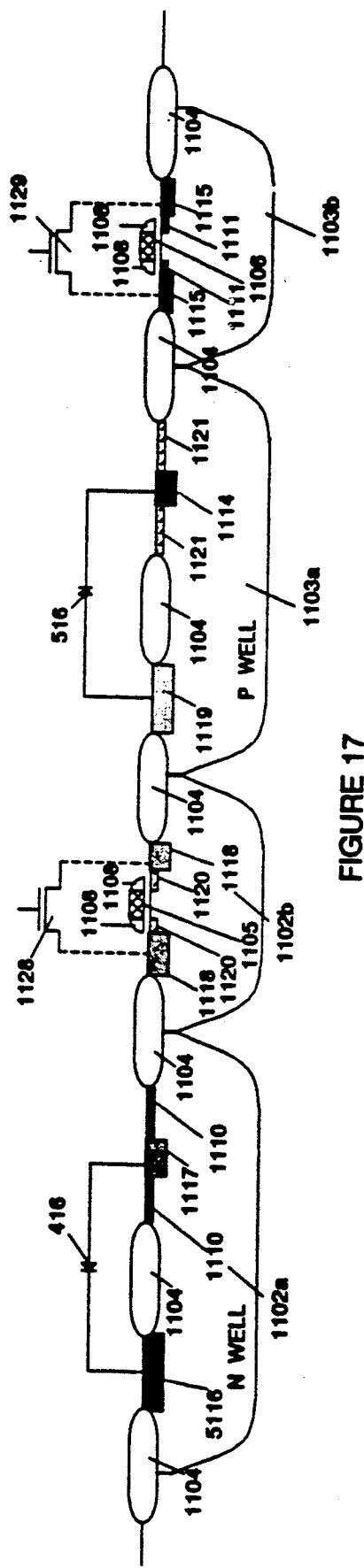
FIG. 17 is a cross sectional view of yet another embodiment.

FIG. 17 depicts an alternative embodiment in which two separate N wells 1102a and 1102b are used, with N well 1102a including one or more novel diodes of this invention and N well 1102b containing one or more MOS devices. Similarly, two separate P wells 1103a and 1103b are used, with P well 1103a including one or move novel diodes of this invention and with P well 1103b including one or more N channel devices. Of interest, the entire structure formed within wells 1102a, 1102b, 1103a, and 1103b is formed simultaneously utilizing a single process sequence.

Likewise, it is to be understood that the embodiment of FIG. 16 can be modified to include two separate N wells, one containing a novel diode of this invention and one containing a P channel device. Similarly, it is to be understood that the embodiment of FIG. 16 can be reversed such that there is one or more P wells including an N channel device and a novel diode of this invention, and a single N well including a P channel device.

Accordingly, as taught by way of the representative examples described herein, a novel ESD protection scheme is taught in which novel semiconductor diodes are fabricated simultaneously with the formation of typical prior art Ldd MOS devices.

In accordance with the teachings of this invention, ESD protection is provided with greater area efficiency than with prior art ESD protection techniques which utilize thin oxide transistors. When utilizing a thin oxide transistor for ESD protection as in the prior art, only that portion of the drain adjacent the gate electrode provides enhanced breakdown and thus ESD protection. Conversely, in accordance with the teachings of this invention, within about the same area required to form a single thin gate oxide protection device two novel diodes of this invention may be formed, each providing ESD protection. Furthermore, in prior art techniques which utilize thin gate oxide transistors, the drain contacts which will carry the undesirably high ESD voltage must be spaced an appropriate distance from the gate electrode in order to prevent destruction of the thin gate oxide transistor, for example either due to thin gate oxide breakdown, or aluminum migration from the aluminum drain contact to the gate electrode. In accordance with the teachings of this invention, since thin gate oxide is not used, the placement of contacts is of little concern.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method of fabricating a semiconductor structure comprising the steps of:
   a) forming within a first bulk region (1103) of a first conductivity type, a lightly doped source/drain region (1111) of a second conductivity type opposite said first conductivity type;
   b) forming within a second bulk region (1102) of said second conductivity type, a second conductivity type lightly doped portion (1110) of a first diode region;
   c) forming within said second bulk region (1102) a lightly doped source/drain region (1120) of said first conductivity type;
   d) forming within said first bulk region (1103) a first conductivity type lightly doped portion (1121) of a first diode region;
   e) forming within said first bulk region (1103) a second conductivity type portion (1114) of said first diode region;
   f) forming within said first bulk region (1103) a source/drain region (1115) of said second conductivity type;
   g) forming within said second bulk region (1102) a second diode region (1116) of said second conductivity type;
   h) forming within said first bulk region (1103) a second diode region (1119) of said first conductivity type;
   i) forming within said second bulk region (1102) a source/drain region (1118) of said first conductivity type; and
   j) forming within said second bulk region (1102) a first conductivity type portion (1117) of said first diode region,
   wherein said first bulk region comprises a lightly doped source/drain MOS device and a diode having said second conductivity type portion of said first diode region formed within said first bulk region serving as a first terminal of said diode and said second diode region within said first bulk region serves as a second terminal of said diode, and
   wherein said second bulk region comprises a lightly doped source/drain MOS device and a diode having said first conductivity type portion of said first diode region within said second bulk region serving as a first terminal of said diode and said second diode region within said second bulk region serves as a second terminal of said diode.

2. A method as in claim 1, wherein steps a and b are performed simultaneously.

3. A method as in claim 2, wherein steps a and b are performed simultaneously using a blanket implant.

4. A method as in claim 1, wherein steps c and d are performed simultaneously.

5. A method as in claim 1, wherein steps e, f, and g are performed simultaneously.

6. A method as in claim 1, wherein steps h, i, and j are performed simultaneously.

7. A method as in claim 1, wherein one or both of said steps of forming within said bulk region said lightly doped source/drain regions utilizes gate electrodes as a portion of a mask and wherein said steps of forming within said bulk regions said source/drain regions utilize gate electrode sidewall spacers as a portion of a mask, thereby providing said source/drain regions laterally spaced apart from said gate electrode by a lightly doped source/drain region.

8. A method as in claim 3, wherein regions implanted by said blanket implant are over compensated in subsequent doping steps of opposite conductivity type.

9. A method of fabricating a semiconductor structure comprising the steps of:
  a) forming within a first bulk region (5103) of a first conductivity type, a lightly doped source/drain region (5111) of a second conductivity type opposite said first conductivity type;
  b) forming within one or more second bulk regions (5102) of said second conductivity type, a second conductivity type lightly doped portion (5110) of a first diode region;
  c) forming within said first bulk region (5103) a source/drain region (5115) of said second conductivity type;
  d) forming within said second bulk regions (5102) a second diode region (5116) of said second conductivity type;
  e) forming within said second bulk regions (5102) a source/drain region (5118) of said first conductivity type; and
  f) forming within said second bulk regions (5102) a first conductivity type portion (5117) of said first diode region,
  wherein said first bulk regions comprise a lightly doped source/drain MOS device, and
  wherein said second bulk regions comprise a MOS device and a diode having said first conductivity type portion of said first diode region within said second bulk regions serving as a first terminal of said diode and said second diode region within said second bulk regions serve as a second terminal of said diode.

10. A method as in claim 9, wherein steps a and b are performed simultaneously.

11. A method as in claim 10, wherein steps a and b are performed simultaneously using a blanket implant.

12. A method as in claim 9, wherein steps c and d are performed simultaneously.

13. A method as in claim 9, wherein steps e and f are simultaneously.

14. A method as in claim 9, which further comprises the s of forming within said second bulk regions (5102) a doped source/drain region of said first conductivity type.

15. A method as in claim 14, wherein one or both of said steps of forming within said bulk regions said lightly doped source/drain regions utilizes gate electrodes as a portion of a mask and wherein said steps of forming within said bulk regions said source/drain regions utilize gate electrode sidewall spacers as a portion of a mask, thereby providing said source/drain regions laterally spaced apart from said gate electrode by a lightly doped source/drain region.

16. A method as in claim 11, wherein regions implanted by said blanket implant are over compensated in subsequent doping steps of opposite conductivity type.

17. A method as in claim 9 which further comprises the step of forming within said first bulk region (5103) a first conductivity type well contact.

18. A method as in claim 17 wherein said step of forming said first conductivity well contact is performed simultaneously with said step of forming said source/drain region within said second bulk regions.

* * * * *